US009968017B2

(12) United States Patent
Yamasaki et al.

(10) Patent No.: US 9,968,017 B2
(45) Date of Patent: May 8, 2018

(54) ELECTROMAGNETIC SHIELDING TUBE

(71) Applicants: FURUKAWA AUTOMOTIVE SYSTEMS INC., Inukami-gun, Shiga (JP); FURUKAWA ELECTRIC CO., LTD., Chiyoda-ku, Tokyo (JP)

(72) Inventors: Masanori Yamasaki, Shiga (JP); Tatsuya Yuasa, Shiga (JP); Yoshiyuki Hirayama, Shiga (JP); Nobuaki Sakai, Shiga (JP); Naoko Omori, Shiga (JP); Masakazu Kozawa, Shiga (JP); Takuro Yamada, Shiga (JP); Manabu Kojima, Shiga (JP)

(73) Assignees: FURUKAWA AUTOMOTIVE SYSTEMS INC., Shiga (JP); FURUKAWA ELECTRIC CO., LTD., Tokyo (JP)

( * ) Notice: Subject to any disclaimer, the term of this patent is extended or adjusted under 35 U.S.C. 154(b) by 10 days.

(21) Appl. No.: 14/633,038

(22) Filed: Feb. 26, 2015

(65) Prior Publication Data
US 2015/0237770 A1   Aug. 20, 2015

Related U.S. Application Data

(63) Continuation of application No. PCT/JP2013/072876, filed on Aug. 27, 2013.

(30) Foreign Application Priority Data

Aug. 27, 2012   (JP) ................................. 2012-186510

(51) Int. Cl.
*H01B 7/00*   (2006.01)
*H05K 9/00*   (2006.01)
(Continued)

(52) U.S. Cl.
CPC ....... *H05K 9/0084* (2013.01); *B60R 16/0215* (2013.01); *H02G 3/0481* (2013.01)

(58) Field of Classification Search
USPC ................................... 174/36, 102 R, 113 R
See application file for complete search history.

(56) References Cited

U.S. PATENT DOCUMENTS 3,512,946 A * 5/1970 Hutkin .................... B32B 15/08
174/394
3,703,605 A * 11/1972 Dembiak ........... H01B 11/1016
174/107

(Continued)

FOREIGN PATENT DOCUMENTS

JP   58-9025 U   1/1983
JP   5-43715 U   6/1993

(Continued)

OTHER PUBLICATIONS

International Search Report for PCT/JP2013/072876 dated Nov. 5, 2013.

(Continued)

*Primary Examiner* — William H Mayo, III
(74) *Attorney, Agent, or Firm* — Hauptman Ham, LLP

(57) ABSTRACT

An electromagnetic shielding tube has a resin inner layer as the innermost layer, a resin outer layer as the outermost layer, and a metal metal-layer between the inner layer and the outer layer. The bonding strength between the outer layer and the metal layer is made weaker with respect to the bonding strength between the inner layer and the metal layer. For example, while an adhesive layer is provided between the inner layer and the metal layer, the outer layer can be directly extrusion coated onto the metal layer without providing an adhesive layer or the like between the outer layer and the metal layer.

5 Claims, 7 Drawing Sheets

(51) Int. Cl.
*H02G 3/04* (2006.01)
*B60R 16/02* (2006.01)

(56) References Cited

U.S. PATENT DOCUMENTS

| | | | | | |
|---|---|---|---|---|---|
| 3,770,556 | A | * | 11/1973 | Evans | B29C 61/10 |
| | | | | | 138/155 |
| 4,327,246 | A | * | 4/1982 | Kincaid | H01B 11/1025 |
| | | | | | 174/105 R |
| 4,439,632 | A | * | 3/1984 | Aloisio, Jr. | H01B 7/18 |
| | | | | | 174/106 D |
| 4,454,379 | A | * | 6/1984 | Cleveland | H01B 7/2825 |
| | | | | | 156/308.6 |
| 4,559,973 | A | * | 12/1985 | Hane | B29C 61/0616 |
| | | | | | 138/138 |
| 5,367,123 | A | * | 11/1994 | Plummer, III | H01B 11/1016 |
| | | | | | 174/1 |
| 5,387,133 | A | * | 2/1995 | Tondreault | H01R 12/721 |
| | | | | | 439/637 |
| 5,866,843 | A | * | 2/1999 | Ikeda | B60R 16/0215 |
| | | | | | 174/36 |
| 5,900,588 | A | * | 5/1999 | Springer | H01B 7/0861 |
| | | | | | 174/117 F |
| 6,064,000 | A | * | 5/2000 | Kim | H01R 4/726 |
| | | | | | 138/138 |
| 6,340,518 | B1 | * | 1/2002 | Kitahara | B32B 7/02 |
| | | | | | 156/153 |
| 6,433,273 | B1 | * | 8/2002 | Kenyon | B32B 5/02 |
| | | | | | 174/110 R |
| 2009/0107694 | A1 | | 4/2009 | Watanabe | |

FOREIGN PATENT DOCUMENTS

| | | | | |
|---|---|---|---|---|
| JP | 9-298382 | A | | 11/1997 |
| JP | 10-117083 | A | | 5/1998 |
| JP | 2007-81158 | A | | 3/2007 |
| JP | 2007-234422 | A | | 9/2007 |
| JP | 2008-71645 | A | | 3/2008 |
| JP | 2010-246296 | A | * 10/2010 | ............... H02G 3/04 |
| JP | 2012-029385 | A | * 2/2012 | ............... H02G 3/04 |
| JP | 2012-065448 | A | * 3/2012 | ............... H02G 3/04 |
| JP | 2012-138457 | A | | 7/2012 |
| JP | 2012-165562 | A | * 8/2012 | ............... H02G 3/04 |
| WO | 2007/029801 | A1 | | 3/2007 |

OTHER PUBLICATIONS

Office Action dated Sep. 9, 2014, corresponding to Japanese patent application No. 2014-523132.
Office Action in CN Application No. 201380044605.4, dated Jul. 21, 2017. 8pp.

* cited by examiner

ELECTROMAGNETIC SHIELDING TUBE

RELATED APPLICATIONS

The present application is a continuation of International Application Number PCT/JP2013/072876, filed Aug. 27, 2013, which claims priority from Japanese Application Number 2012-186510, filed Aug. 27, 2012, the disclosures of which application are hereby incorporated by reference herein in their entirety.

FIELD OF THE INVENTION

This invention relates to an electromagnetic shielding tube for an electric car through which an electric wire is inserted.

BACKGROUND ARTS

Conventionally, metal tubes such as steel tubes or aluminum pipes, or resin-made corrugated tubes are used as cable protecting tubes. In these cases, problems such as the influence of noises generated from the cable inside the protecting tube or the influence of noises from outside on the cable inside may occur. For example, in a hybrid car, in order to protect the cable that supplies three-phase AC output from the inverter to the drive motor, a protecting tube is arranged at the lower part and the like of the car body to fit the shape of the car body. On this occasion, noises generated from the cable disturb the radio and the like. Therefore, shielding is necessary.

As such a protecting tube, there is a metal tube that is made of metal, in which the outermost layer is made of stainless steel and the other layers are made of iron to improve durability (See Patent Document 1).

Also, there is a corrugated tube made of resin having a metal plated layer (See Patent Document 2).

BACKGROUND ART DOCUMENTS

Patent Documents

[Patent Document 1] Japanese Unexamined Patent Application Publication No. 2007-81158 (JP-A-2007-81158)
[Patent Document 2] Japanese Unexamined Patent Application Publication No. H09-298382 (JP-A-H09-298382)

SUMMARY OF THE INVENTION

Problems to be Solved by the Invention

However, the metal tube in Patent Document 1 is made of metal and has a problem of weight. If the thickness of the metal tube is decreased to solve this problem, the bent part may crush and flatten when bent, and it becomes difficult to maintain the predetermined internal diameter. Also, since a certain thickness is required, a large processing machine is needed for bending process. Therefore, workability of product shaping process is not always good.

Also, particularly in an electric car, electromagnetic shielding tubes are usually disposed at the lower part of the car, and higher corrosion resistance property against water wetting and higher external damage resistance property against stone hitting and the like are required. However, the metal tube mentioned above may be easily dented by the impact of stone hitting and the like on the external surface. Also, the cost is higher if stainless steel is used as in Patent Document 1. Also, such protection tubes have a possibility of not only attachment of water from outside, but attachment of water inside due to dew condensation and the like. Therefore, forming a stainless layer only on the outermost layer does not completely solve the problem of corrosion.

Also, as in Patent Document 2, the method in which a metal layer is plated on a resin corrugated tube has a problem of peeling or corrosion of the plating and the like.

Particularly in an electric car, substantial noise is generated and may influence on other electric components. However, the method of forming a metal layer on a resin-made corrugated tube by using an electroless plating method as in Patent Document 2 has a limit in the thickness of the metal layer, which can be effective in shielding property, and it is difficult to secure both high shielding property and close contact between the metal layer and the resin layer.

Also, environmental temperature, heat from the motors and the like influence an electric car. Therefore, it is necessary to prevent deformation or malfunction caused by the temperature change. However, since the metal layer produced by the method introduced in Patent Document 2 is thin, the metal layer may deform easily due to the difference between the linear expansion coefficients of the resin corrugated tube and the metal layer. Also, repetition of such deformation may damage the metal layer.

Also, resin-made corrugated tubes are usually flexible. For this reason, on the occasion of fixing the corrugated tubes on a car, it is necessary to place the corrugated tubes at predetermined positions of the car and fix the predetermined parts while adjusting the positions. Therefore, a large number of fixing components are required, and workability of laying and fixing the corrugated tubes to the car is low.

The present invention was achieved in view of such problems. Its object is to provide an electromagnetic shielding tube with less corrosions, less dents on the surface and the like, having high shielding property, high shape-retaining property and excellent workability of laying.

Means for Solving Problems

To achieve the above-mentioned object, the present invention provides an electromagnetic shielding tube for an electric car through which an electric wire can be inserted comprising: an inner layer made of resin, a metal layer formed on the periphery of the inner layer, and an outer layer made of resin formed on the periphery of the metal layer, wherein the electromagnetic shielding tube is a composite tube, with laminated layers of the inner layer, the metal layer and the outer layer, and the bonding strength between the inner layer and the metal layer is stronger than the bonding strength between the metal layer and the outer layer.

It is preferable that the inner layer and the metal layer adhere by an adhesive and the metal layer and the outer layer do not adhere by an adhesive.

It is preferable that the metal layer is made by forming a strip-shaped member into a cylinder, butting both ends of the strip-shaped member, and bonding the butted part by welding.

It is preferable that the resin forming the outer layer is cross-linked.

It is preferable that the thickness of the inner layer is thicker than the thickness of the outer layer.

According to the present invention, since the metal layer is formed inside, shielding effect for the electric wire that is inserted through thereof can be provided. Also, since the inner and the outer layers are made of resin and the metal layer is formed as an intermediate layer, the metal layer is not exposed on the inner surface and the outer surface of the electromagnetic shielding tube, preventing the electromagnetic shielding tube from corrosion.

Also, making the bonding strength between the inner layer and the metal layer stronger than the bonding strength between the outer layer and the metal layer makes it easy to remove only the outer layer. Therefore, terminal processing and the like of the electromagnetic shielding tube are easy. Here, the bonding strength in the present invention includes the cases of not only adhering by adhesives but also bonding by fusion and the like.

Also, since the resin layers have thermal insulating property, dew condensation is hard to occur inside the tube and problems such as electric breakdown and the like of the electric wire inside caused by dew condensation may not arise.

Also, the thickness of the metal layer may be reduced to the minimum thickness which is sufficient to secure shielding property, shape-retaining property and durability. Therefore, bending process is easier compared to the tube which is entirely made of metal layers. So bending process can be performed with hands or simple apparatus such as a small hand-powered bender and so on, without using a large-sized hydraulic bender and the like that are used in bending process of metal tubes.

Also, unlike the conventional corrugated tubes, the metal layer is not formed by plating on the resin so that the electromagnetic shielding tube as a whole has shape-retaining property (when the composite tube is bent, the bent shape is retained and the tube does not return to its original shape unless an external force that can cause plastic deformation is given to the tube). Therefore, it is possible to process the shape in advance to fit the fixing layout to the car. Therefore, it excels in workability of laying the electromagnetic shielding tube.

Also, since resin layers are provided on the inner layer side and the outer layer side of the metal layer particularly, the metal layer is not crushed inwardly and flattened at the bent part. Also, since the tube consists of approximately resin as a whole, weight reduction, compared to the one which entirely consists of metal, can be achieved. Particularly, making the metal layer thinnest and making the inner layer thickest can surely obtain the above-mentioned effects. Also, since the inner layer is thick, it is possible to improve the roundness of the resin tube of the inner layer when manufacturing.

Also, even if stones and the like collide against the periphery, dents and the like may not occur on the metal layer because of the elastic resin-made outer layer.

Also, cross-linking the outer layer can enhance close contact between the outer layer and the metal layer. If the outer layer and the metal layer adhere by an adhesive and the like, removal of the outer layer becomes difficult in terminal processing of the shielding tube. On the other hand, if the outer layer and the metal layer are not completely in contact and a gap is produced, it may cause flattening of the metal layer. Therefore, by cross-linking the outer layer, detachability between the outer layer and the metal layer can be secured while flattening of the metal layer is suppressed.

Also, forming the metal layer by butt welding the strip-shaped member can reduce the thickness change in the circumferential direction. Therefore, buckling of the metal layer, with the thickness changing part as a starting point, can be prevented.

Effects of the Invention

The present invention can provide an electromagnetic shielding tube with less corrosions, less dents on the surface and the like, having high shielding property, high shape-retaining property and excellent workability of laying.

DETAILED DESCRIPTION OF THE PREFERRED EMBODIMENTS

Figure 1:
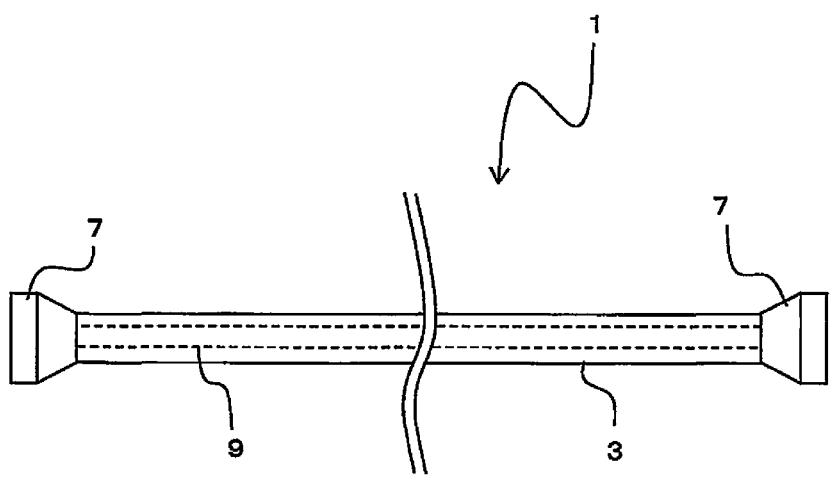
FIG. 1 shows a shielding cable 1.

Hereinafter, a shielding cable 1 according to an embodiment of the present invention will be described. FIG. 1 shows a shielding cable 1. The shielding cable 1 mainly comprises an electromagnetic shielding tube 3, terminals 7, an electric wire 9 and the like.

The electric wire 9 is inserted through the electromagnetic shielding tube 3. The terminals 7 are connected to both ends of the electric wire 9 which is a covered wire.

Figure 2:
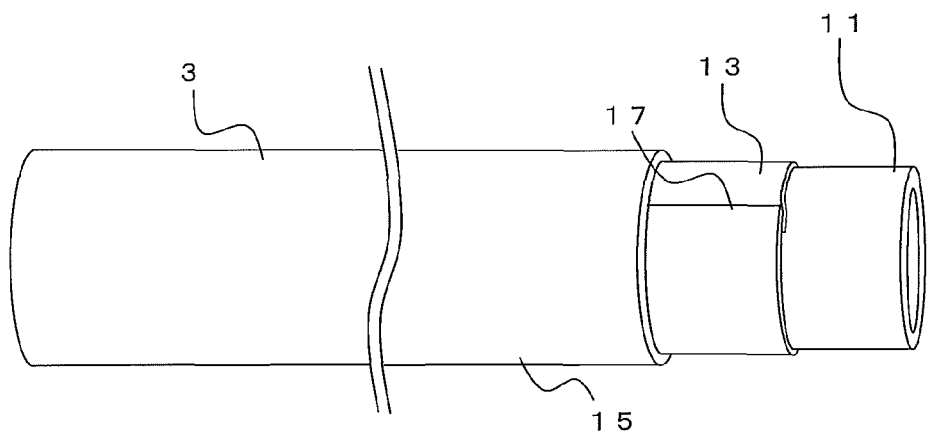
FIG. 2(a) is a perspective view of an electromagnetic shielding tube 3 and FIG. 2(b) is a cross-sectional view of an electromagnetic shielding tube 3.
Figure 2:
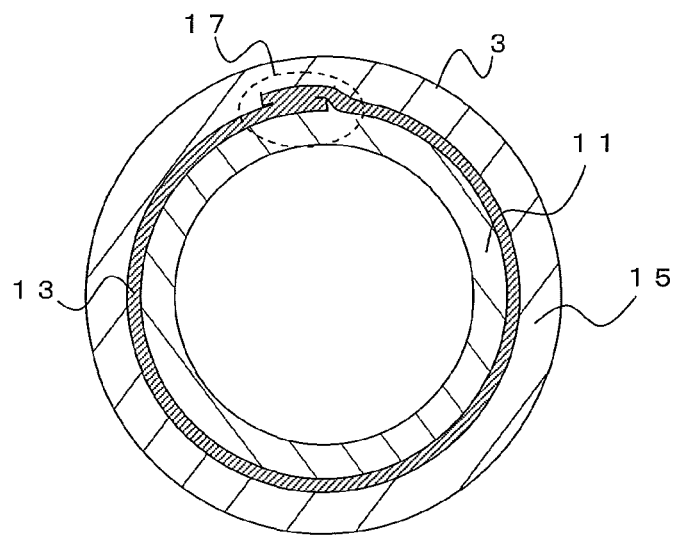

FIG. 2 shows the electromagnetic shielding tube 3 in which FIG. 2(a) is a perspective view and FIG. 2(b) is a cross-sectional view. The electromagnetic shielding tube 3 has an inner layer 11 made of resin formed as the innermost layer, an outer layer 15 made of resin formed as the outermost layer, and a metal layer 13 made of metal formed between the inner layer 11 and the outer layer 15.

The same or different resin may be used to form the inner layer 11 and the outer layer 15. For example, the resin can be selected from polyolefin resin such as polypropylene or polyethylene and the like, or thermoplastic resin such as polyamide or polybutylene terephthalate and the like. In addition, the resin may be cross-linked or modified. For example, the resin may be cross-linked to improve heat resistance property, or may be modified with maleic acid to improve adhesion property. Also, fire retarding materials such as halogen-based materials, phosphorus-based materials, or metal hydrate and the like may be added, or titanium oxide and the like may be added to improve weather resistance property.

In addition, these fire retarding materials or additives to improve weather resistance property and the like may be added only to the resin forming the outer layer 15. That is, the addition is unnecessary for the resin of the inner layer 11, which does not need fire retarding property or weather resistance property.

Copper or iron may be used for the metal layer 13 as long as shielding effect can be obtained. However, taking weight reduction, cost and the like into consideration, it is preferable to be made from aluminum (including aluminum alloys).

At least one of the inner layer 11 and the outer layer 15 is to be formed thicker than the metal layer 13. For example, as shown in the figure, both the inner layer 11 and the outer layer 15 can be thicker than the metal layer 13. This can prevent flattening of the electromagnetic shielding tube 3, particularly at the time of bending. That is, making the inner layer 11 sufficiently thick can prevent the metal layer 13 from flattening towards inside and making the outer layer 15 sufficiently thick can prevent the metal layer 13 from flattening. For example, if the metal layer 13 is bent and the periphery of the bent part of the metal layer 13 tends to crush and flatten, the outer layer 15 gives an action to restore the metal layer 13 to the circular shape before bending, and flattening of the metal layer 13 can be prevented.

In addition, the thickness of the metal layer 13 is determined so that the required shielding property can be obtained and rigidity of the bent metal layer 13 is larger than the restoring force of the inner layer 11 and the outer layer 15 that tends to return to the original state when the electromagnetic shielding tube 3 with the inner layer 11 and the outer layer 15 is bent. That is, when the electromagnetic shielding tube 3 is bent, the metal layer 13 inside is plastically deformed and the inner layer 11 and the outer layer 15 are elastically deformed due to their own flexibility. Here, if rigidity of the bent metal layer 13 is larger than the restoring force of the inner layer 11 and the outer layer 15 in elastic deformation, the electromagnetic shielding tube 3 can retain its bent shape.

Here, in order to secure the required shielding property, it is preferable that the thickness of the metal layer 13 is 0.07 mm or more. However, it is preferable to consider the stress caused due to the difference between the linear expansion coefficients of the inner layer 11, the outer layer 15 and the metal layer 13, to set the thickness of the metal layer 13. That is, the linear expansion coefficients are different between the inner layer 11 and the outer layer 15 made of resin, and the metal layer 13 made of metal. Therefore, according to the temperature change, the stress is given to the intermediate metal layer 13. At this time, the damage caused by repeated plastic deformation can be prevented if the stress is within a range of elastic deformation (for example, 0.2% or less of yield stress for aluminum).

The stress occurring on the metal layer 13 depends on the difference between its linear expansion coefficient and the linear expansion coefficients of the inner layer 11 and the outer layer 15, usage environment, the respective thicknesses and so on. In ordinary operating condition of an electric car, if the thickness of the metal layer 13 is 0.15 mm or more, the metal layer 13 can be prevented from being given the stress over the yield stress by the inner layer 11 and the outer layer 15. Therefore, the thickness of the metal layer 13 is preferred to be 0.15 mm or more.

Also, it is preferable to set the thickness of the outer layer 15 taking damage resistance property into consideration. In ordinary operating condition of an electric car, the outer layer 15 has a role of a protecting layer, preventing the metal layer 13 from damages by stone hitting and the like. For the outer layer 15 to fully operate as a protecting layer, the thickness is preferably 0.5 mm or more. This is because if the thickness is less than 0.5 mm, the outer layer 15 may be damaged by stone hitting and the like and the metal layer 13 inside may be broken.

Figure 3:
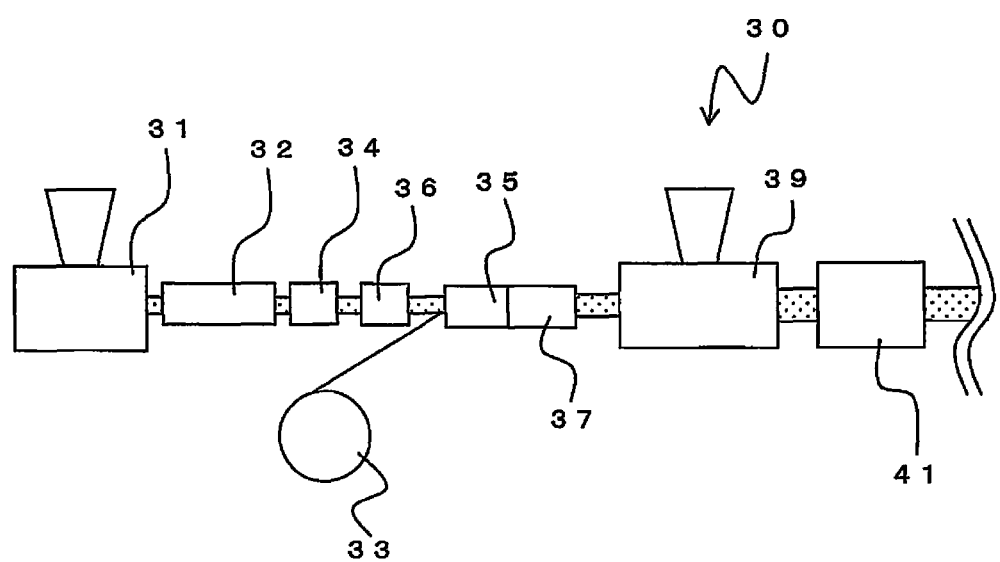
FIG. 3 is a schematic view of an electromagnetic shielding tube manufacturing apparatus 30 that manufactures the electromagnetic shielding tube 3.

Next, a method for manufacturing the electromagnetic shielding tube 3 will be described. FIG. 3 is a schematic view of an electromagnetic shielding tube manufacturing apparatus 30. Here, cutters, chilling machines and the like are omitted in the figure. First, a resin tube to be the inner layer 11 is produced by extrusion using an inner layer extruder 31. Since the resin tube to be the inner layer 11 contracts in cooling after extrusion, the resin tube is sized by a vacuum sizing machine 32. The vacuum sizing machine 32 suppresses contraction of the outer diameter of the resin tube by evacuating the mold, having the resin tube in between, from outer surface side and thus pressing the resin tube on the inner periphery of the mold, for example. After that, if necessary, adhesive may be coated around the periphery of the resin tube by an adhesive coater 34.

Next, the resin tube goes through an outer diameter measuring apparatus 36 to measure the outer diameter of the resin tube. The outer diameter measuring apparatus 36 is, for example, a laser measuring apparatus. If the outer diameter of the resin tube measured by the outer diameter measuring apparatus 36 is within the predetermined range, manufacturing process is proceeded. Whereas if the outer diameter of the resin tube measured by the outer diameter measuring apparatus 36 is not within the predetermined range, then the size of the mold of the vacuum sizing machine 32 and the like are changed.

Next, while a strip-shaped member provider 33 feeds a metal thin plate (including a metal sheet), which is a strip-shaped member that forms the metal layer 13, the metal thin plate is forming processed through a forming processor 35 and sent to the periphery of the resin tube of the inner layer 11 to form a cylinder with a part thereof being overlapped. A welder 37 then welds the overlapped part of the strip-shaped member. This forms the metal layer 13 on the periphery of the resin tube of the inner layer 11.

Furthermore, an outer layer extruder 39 extrudes outer layer resin to cover the periphery of the metal layer 13 to complete the electromagnetic shielding tube 3.

Furthermore, the outer layer 15 is cross-linked by a cross-linking section 41 if necessary. In addition, the cross-linking section 41 can cross-link the outer layer 15 by ultraviolet ray or heat. Here, it is possible to cross-link the inner layer 11 simultaneously, but it is also possible to cross-link only the outer layer 15. In this way, only the outer layer 15 can be cross-linked while the inner layer 11 is non-cross-linked. Cross-linking the outer layer 15 can enhance close contact between the outer layer 15 and the metal layer 13. Therefore, flattening of the metal layer 13 can be prevented while detachability between the outer layer 15 and the metal layer 13 is secured.

Manufacturing in this way forms a lapped part 17 on a part of the metal layer 13 as shown in FIG. 2(*b*). In addition, both ends of the strip-shaped member at the lapped part 17 are surely in contact since the lapped part 17 is pressed from outside when the outer layer 15 is coated. Therefore, in the cross-sectional view of the figure, no gaps are formed in the metal layer 13, which is a shielding layer.

As mentioned above, before coating the outer layer 15, the welder 37 bonds at least a part of the lapped part 17 by butt welding, ultrasonic welding and the like. In addition, a part of the lapped part 17 may be abutted directly and another part may adhere by an adhesive. In either method, it is preferable that the metal layer 13 is continuous (electrically conducted) in the circumferential direction. In this way, shielding property can be surely secured.

Figure 4:
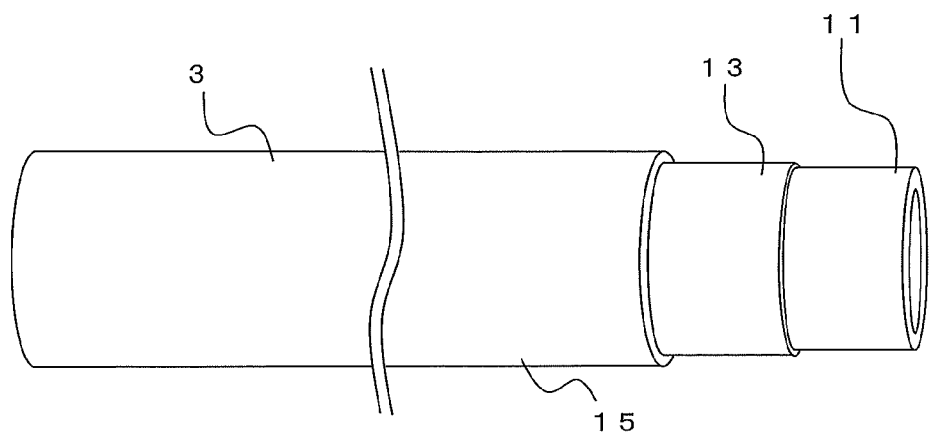
FIG. 4(a) is a perspective view of another embodiment of the shielding tube 3 and FIG. 4(b) is a cross-sectional view of another embodiment of the shielding tube 3.
Figure 4:
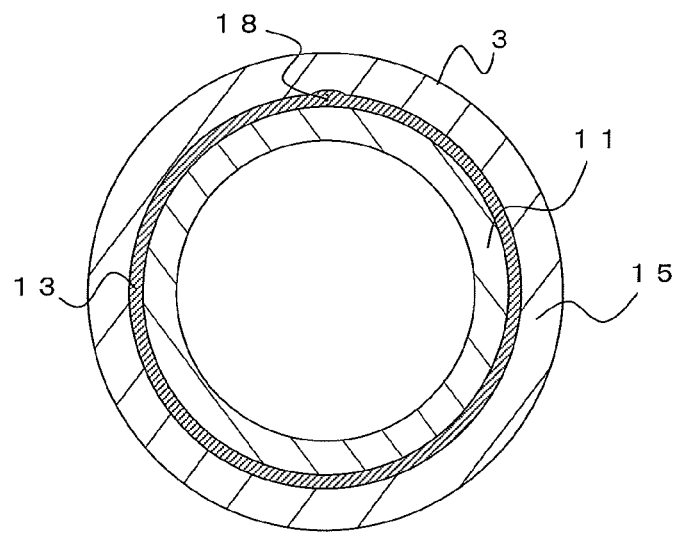

Also, butt welding may be performed without forming the lapped part 17 as shown in FIG. 4(*a*) and FIG. 4(*b*). In this case, the strip-shaped member is made cylindrical and the ends (butted part 18) of the strip-shaped member are butted to each other, and then the welder 37 bonds the butted part 18 by welding. In this case, the metal layer 13 is also continuous in the circumferential direction so that shielding property can be surely secured.

By butt welding in this way, there is no lapped part of the strip-shaped member, and therefore the thickness change in the circumferential direction of the metal layer 13 is small. A part of large thickness change of the metal layer 13 tends to become a starting point of buckling when the electromagnetic shielding tube 3 is bent. Therefore, butt welding can suppress this buckling to occur.

Here, as mentioned above, in the present invention, the outer diameter of the resin tube is managed using the outer diameter measuring apparatus 36. Therefore, when the metal thin plate is butted to make a cylindrical form, forming a gap between the resin tube and the metal thin plate (the metal layer 13) can be suppressed. In addition, the resin tube contracts slightly in its outer diameter during the time after passing through the aforementioned outer diameter measuring apparatus 36 and before the metal thin plate is forming processed on the periphery thereof. So, in the present invention, the amount of contraction in the outer diameter of the resin tube at the interval between the outer diameter measuring apparatus 36 and the forming processor 35 is measured in advance, and the acceptable outer diameter in measurement by the outer diameter measuring apparatus 36 is to be set larger than the value of the optimum outer diameter of the resin tube at the time of forming process by the amount of contraction. Thereby, the metal layer 13 can be in close contact with the resin tube (the inner layer 11).

For example of such an electromagnetic shielding tube, the one with the inner diameter of 22.4 mm, 0.6 mm thickness of the inner layer 11, 0.2 mm thickness of the metal layer 13, 0.5 mm thickness of the outer layer 15, and the outer diameter of 25 mm can be used. This electromagnetic shielding tube 3 having the inner layer 11 and the outer layer 15 made of polypropylene and the metal layer 13 made of aluminum can be bent easily with a hand-powered bender.

Also, an adhesive layer and the like may be provided between the inner layer 11 and the metal layer 13 or between the metal layer 13 and the outer layer 15, respectively. Here, in the present invention, as for the metal layer formed on the periphery of the inner layer, it is not limited to the case in which the inner layer 11 is in direct contact with the metal layer 13 and the case in which another layer is formed between the inner layer 11 and the metal layer 13 is included.

Similarly, as for the resin-made outer layer formed on the periphery of the metal layer, it is not limited to the case in which the metal layer 13 is in direct contact with the outer layer 15 and the case in which another layer is formed between the metal layer 13 and the outer layer 15 is included.

Here, the bonding strength between the outer layer 15 and the metal layer 13 is preferably made weaker than the bonding strength between the inner layer 11 and the metal layer 13. For example, while an adhesive layer is provided between the inner layer 11 and the metal layer 13, the outer layer 15 can be directly extrusion coated on the metal layer 13 without providing an adhesive layer and the like between the outer layer 15 and the metal layer 13. It is necessary for the inner layer 11 to adhere since the influence of deformation due to the difference between the linear expansion coefficients of the metal layer 13 and the inner layer 11 is significant. However, it is unnecessary for the outer layer 15 to adhere since the influence of deformation is small compared to the inner layer 11. Thereby, removal of only the outer layer 15 can be easily performed, and when removing the outer layer 15, the metal layer 13 can be prevented from stripping off with the outer layer 15 and tearing, etc. Therefore, when using as a shielding cable 1 shown in FIG. 1, connecting with terminals 7 and the like can be easily performed.

Additionally, in order to make the bonding strength between the outer layer 15 and the metal layer 13 weaker than the bonding strength between the inner layer 11 and the metal layer 13, the roughness of the surface of the metal layer 13 facing the inner layer 11 may be rougher than the roughness of the surface facing the outer layer 15. Also, for the resin of the inner layer 11, resin having higher adhesion property with the metal layer 13 than the resin of the outer layer 15 may be selected.

Next, a laying structure of the shielding cable using the shielding cable 1 of the present invention will be described. FIG. 5(a) shows a laying structure of the shielding cable and FIG. 5(b) is a cross-sectional view of the shielding cable 1. In addition, the embodiment of the laid shielding cable is not limited to the illustrated example.

The shielding cable 1 is laid, for example, on the lower part of a car with a predetermined layout and fixed to the car body and the like with predetermined intervals. At this time, predetermined parts of the shielding cable 1 are bent with predetermined curvatures in advance and partially fixed to the car with fixing members 19. Additionally, the bent shapes of these bent parts are not limited to the illustrated shape, and the angles or radii of bent parts are decided appropriately according to the layout.

An electric wire 9, which is a high-voltage electric wire, for example, is inserted through the shielding cable 1. In addition, although the illustrated example shows an example with two electric wires 9 inserted, the present invention is not limited thereto.

As a shielding cable laying structure, for example, two electric wires 9 having 8 mm diameters are inserted through the above-mentioned shielding cable (inner diameter 22.4 mm) with one end part (a terminal) being connected to an inverter (not shown) and the another end part (a terminal) being connected to a motor and the like (not shown). Additionally, the metal layer 13 is electrically connected to an electrically conductive shielding case (not shown) containing the inverter.

As mentioned above, the present embodiment has shielding property since the metal layer 13 is provided as an intermediate layer. Furthermore, since the inner layer 11, the metal layer 13 and the outer layer 15 are integrally formed, the positions of each layer in the axial direction do not shift and the metal layer 13 inside does not slip off.

Also, since the bonding strength between the outer layer 15 and the metal layer 13 is weak, it is easy to remove only the outer layer 15. Therefore, it is possible to connect easily with the terminals 7 by stripping off only the outer layer 15 in the vicinity of the end parts of the electromagnetic shielding tube 3.

Also, since the metal layer 13 is 0.15 mm or more, it is possible to secure sufficient shielding property as well as to prevent repeated plastic deformation caused by the stress according to the temperature change. Therefore, an electromagnetic shielding tube with high durability can be obtained.

Also, since the thickness of the outer layer 15 is 0.5 mm or more, the metal layer 13 inside can be prevented from being damaged by stone hitting and the like when used in an electric car.

Also, since rigidity of the metal layer 13 is larger than the restoring force caused by elastic deformation of the other layers, i.e. the inner layer 11 and the outer layer 15, it is possible to retain the shape bent in bending process. At this time, processing is easy because the metal layer 13 is thin compared to the conventional metal tube. Therefore, by performing bending process according to the laying form of the shielding cable in advance, laying workability of a shielding cable (an electromagnetic shielding tube) excels and the number of fixing members 19 used for a car can be reduced compared to the case using conventional flexible tubes and the like.

Also, since the inner layer 11 and the outer layer 15 are made of resin, the electromagnetic shielding tube 3 does not corrode by attachment of water from outside, water entering inside, dew drops and the like. Furthermore, dew drops occurring inside can be prevented since the inner layer 11 and the outer layer 15 has thermally insulation effect.

Also, making the inner layer 11 and the outer layer 15 thicker than the metal layer 13 prevents the metal layer 13 from flattening (buckling) at the bent part when the electromagnetic shielding tube 3 is bent.

Also, since the metal layer 13 is configured from a strip-shaped member, manufacturing the electromagnetic shielding tube 3 is easy. It is also possible to secure shielding property surely since the lapped part or the butted part is formed and the end parts of the strip-shaped member are in contact with each other at the lapped part or the butted part.

Next, another embodiment will be described. FIG. 6 shows another laying structure of the shielding cable 1. Additionally, in the explanations below, the same numerals with FIG. 1 to FIG. 5 will be used to show the elements having the same functions as the elements in FIG. 1 to FIG. 5 and redundant explanations will be omitted.

Figure 5:
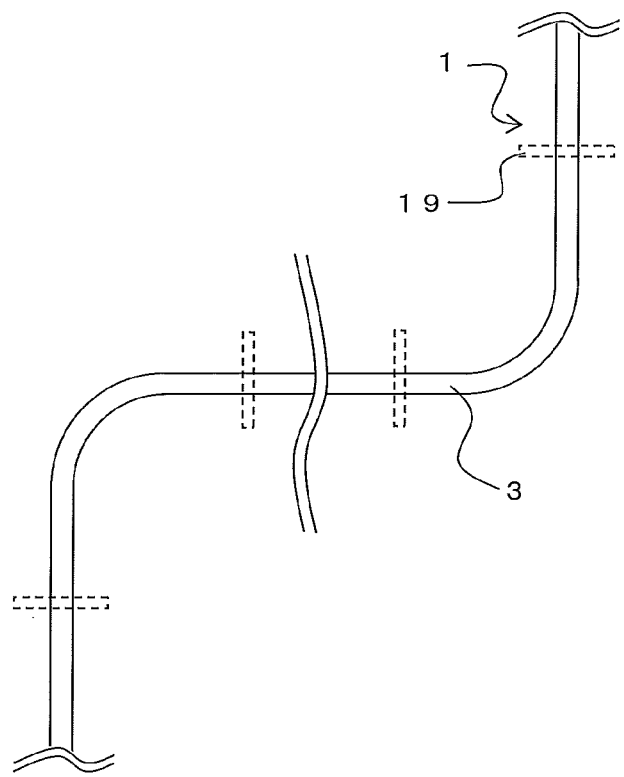
FIG. 5(a) is a perspective view of a laying condition of the shielding cable 1 and FIG. 5(b) is a cross-sectional view of a laying condition of the shielding cable 1.
Figure 5:
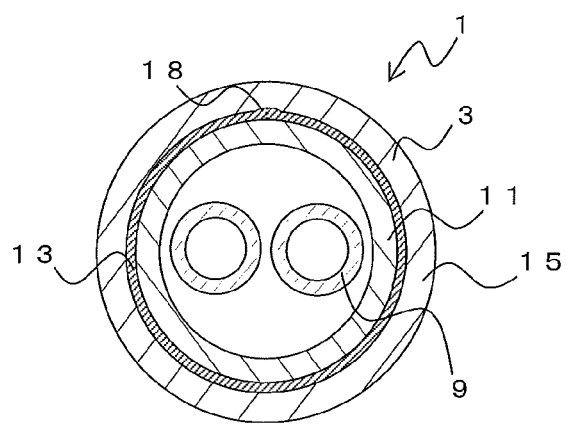
Figure 6:
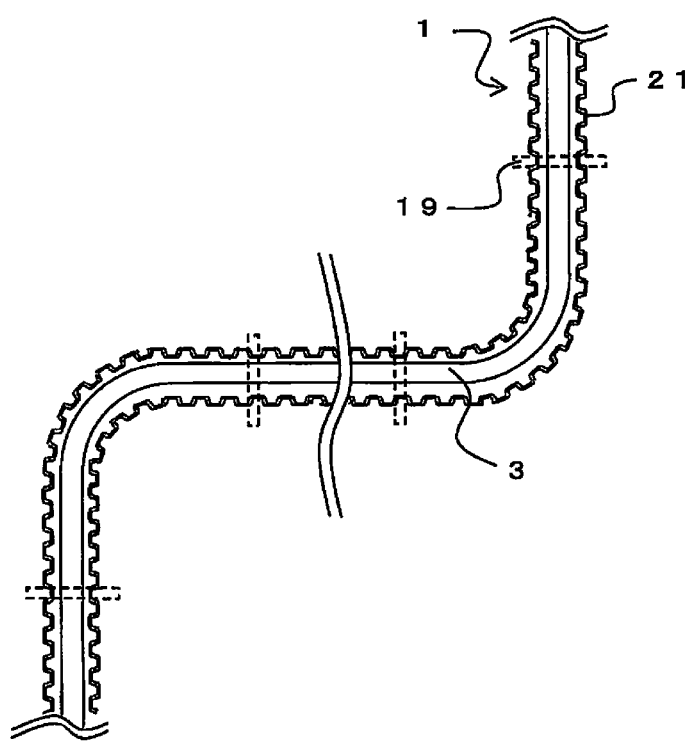
FIG. 6 shows another laying condition of the shielding cable 1.

The laying structure of a shielding cable shown in FIG. 6 is approximately similar to the laying structure of the shielding cable shown in FIG. 5, except an outer tube 21 is provided on the periphery of the shielding cable 1. The outer tube 21 is, for example, a resin-made corrugated tube. The outer tube 21 is used to protect the shielding cable 1 from outside. Thereby, the electromagnetic shielding tube 3 can be more surely protected.

Although the embodiments of the present invention have been described referring to the attached drawings, the technical scope of the present invention is not limited to the embodiments described above. It is obvious that persons skilled in the art can think out various examples of changes or modifications within the scope of the technical idea disclosed in the claims, and it will be understood that they naturally belong to the technical scope of the present invention.

Figure 7:
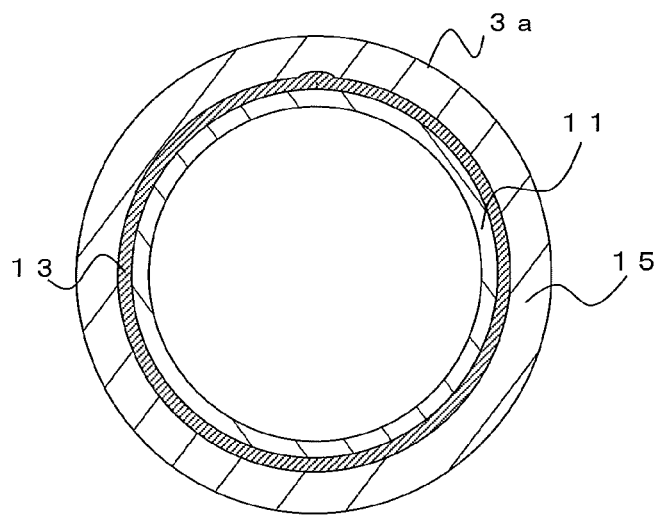
FIG. 7(a) shows an electromagnetic shielding tube 3a and FIG. 7(b) shows an electromagnetic shielding tube 3b.
Figure 7:
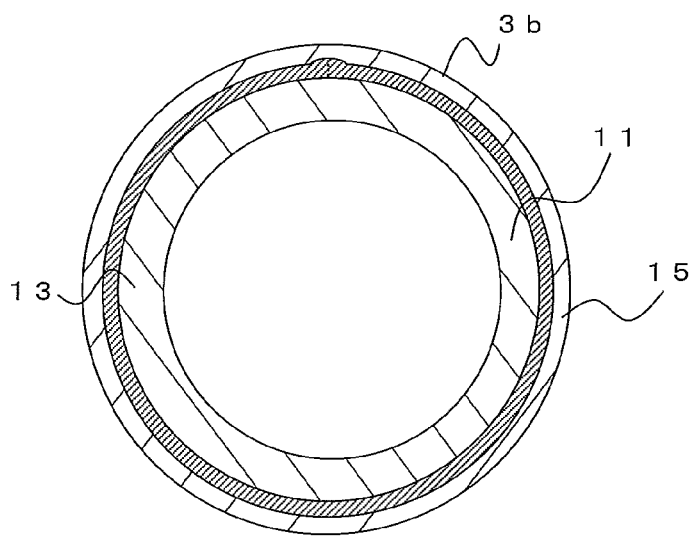

For example, the thickness of the inner layer 11 and the outer layer 15 can be appropriately decided according to the required property. FIG. 7(*a*) shows an electromagnetic shielding tube 3*a* with a thin inner layer 11 and a thick outer layer 15. The electromagnetic shielding tube 3*a* has extremely high external damage resistance property. That is, when stones and the like collide from outside, the metal layer 13 does not get damaged since the outer layer 15 is sufficiently thick. Also, when the electromagnetic shielding tube 3*a* is bent, flattening of the cross section can be prevented.

Also, since the distance from the periphery to the metal layer 13 in the electromagnetic shielding tube 3 is long, the corrosion of the metal layer 13 can be prevented further even if water percolates through the resin from outside. In addition, even if the inner layer 11 is made thinner to the extent in which shape retaining property and the like are not influenced, the metal layer 13 is not exposed and still effective in corrosion resistant property and the like.

Also, an electromagnetic shielding tube 3*b* with a thick inner layer 11 and a thin outer layer 15 as shown in FIG. 7(*b*) may be used. According to the electromagnetic shielding tube 3*b*, flattening of the bent part of the metal layer 13 in bending process can be more surely prevented. Therefore, the inner diameter at the bent part does not become small. Therefore, workability of inserting an electric wire is good because the inner diameter does not become small at the bent part.

Also, the electromagnetic shielding tube 3*b* with the thin outer layer 15 requires less amount of resin to configure the outer layer. Therefore, the amount of additives or pigments can be reduced, when additives or pigments are added only to the outer layer, as mentioned above. In addition, even if the outer layer 15 is made thinner to the extent in which shape retaining property, external damage resistance property and the like are not influenced, the metal layer 13 is not exposed and still effective in corrosion resistance property and the like.

Also, since the thickness of the resin tube of the inner layer 11 is thick when the inner layer 11 is extrusion formed, the roundness of the resin tube can be improved. Furthermore, it is easy to cross-link the outer layer 15 since the outer layer 15 is thin. In this case, the one with the inner diameter of 21.5 mm, 0.95 mm thickness of the inner layer 11, 0.45 mm thickness of the metal layer 13, 0.6 mm thickness of the outer layer 15, and the outer diameter of 25.5 mm can be used.

EXPLANATION OF NUMERALS

1 . . . shielding cable
3, 3*a*, 3*b* . . . electromagnetic shielding tube
7 . . . terminal
9 . . . electric wire
11 . . . inner layer
13 . . . metal layer
15 . . . outer layer
17 . . . lapped part
18 . . . butted part
19 . . . fixing member
21 . . . outer tube
30 . . . shielding tube manufacturing apparatus
31 . . . inner layer extruder
32 . . . vacuum sizing machine
33 . . . strip-shaped member provider
34 . . . adhesive coater
35 . . . forming processor
36 . . . outer diameter measuring apparatus
37 . . . welder
39 . . . outer layer extruder
41 . . . cross-linking section

What is claimed is:

1. An electromagnetic shielding tube for an electric car through which an electric wire can be inserted comprising;
an inner layer made of resin,
a metal layer formed on the periphery of the inner layer, and
an outer layer made of resin formed on the periphery of the metal layer, wherein
the electromagnetic shielding tube is a composite tube, with laminated layers of the inner layer, the metal layer and the outer layer, wherein each layer comprises a straightforward tube,
the bonding strength between the inner layer and the metal layer is stronger than the bonding strength between the metal layer and the outer layer, the thickness of the inner layer is thicker than the thickness of the outer layer, and the metal layer is made by forming a strip-shaped member into a cylinder, butting both ends of the strip-shaped member without forming a lapped part, and bonding the butted part by welding, and the resin of the inner layer has a higher adhesion property with the metal layer than the resin of the outer layer.

2. The electromagnetic shielding tube according to claim 1, wherein only the inner layer and the metal layer adhere by an adhesive and the metal layer and the outer layer do not adhere.

3. The electromagnetic shielding tube according to claim 1, wherein the resin forming the outer layer is cross-linked.

4. The electromagnetic shielding tube according to claim 1, wherein the thicknesses of the inner layer and the outer layer are thicker than the thickness of the metal layer.

5. The electromagnetic shielding tube according to claim 1, wherein the roughness of the surface of the metal layer facing the inner layer is rougher than the roughness of the surface facing the outer layer.

* * * * *